United States Patent [19]

Horstmann

[11] 4,251,844
[45] Feb. 17, 1981

[54] FAULT INDICATOR CASE AND MOUNT

[75] Inventor: Hendrik Horstmann, Ratingen, Fed. Rep. of Germany

[73] Assignee: Dipl.-Ing. H. Horstmann GmbH, Heiligenhaus, Fed. Rep. of Germany

[21] Appl. No.: 940,497

[22] Filed: Sep. 8, 1978

[51] Int. Cl.³ ............................................. G01R 19/16
[52] U.S. Cl. .......................................... 361/1; 340/664; 248/74 A; 248/67.7; 24/138
[58] Field of Search ............... 340/664, 644; 248/67.7, 248/230, 70; 24/257, 138, 129 W

[56] References Cited

U.S. PATENT DOCUMENTS

| | | | |
|---|---|---|---|
| 1,978,033 | 10/1934 | Suppes | 24/257 R |
| 2,096,580 | 10/1937 | Frank et al. | 24/257 R |
| 2,360,164 | 10/1944 | Santora | 24/257 R |
| 2,885,758 | 5/1959 | Russo et al. | 24/138 R |
| 3,286,963 | 11/1966 | Bergman | 248/74 A |
| 3,485,468 | 12/1969 | Schweitzer, Jr. | 248/74 A |
| 3,991,366 | 11/1976 | Schweitzer, Jr. | 340/664 |

Primary Examiner—J. D. Miller
Assistant Examiner—L. C. Schroedor
Attorney, Agent, or Firm—Smyth, Pavitt, Siegemund, Jones & Mart Ella

[57] ABSTRACT

The fault indicator case has a concave mounting surface along which extend two legs having at their ends mounted jaws with serrated surfaces for engaging cable from below. Camming surfaces on the jaws facilitate placing the case on the cable. A shield can be fastened to the case after having been mounted.

7 Claims, 4 Drawing Figures

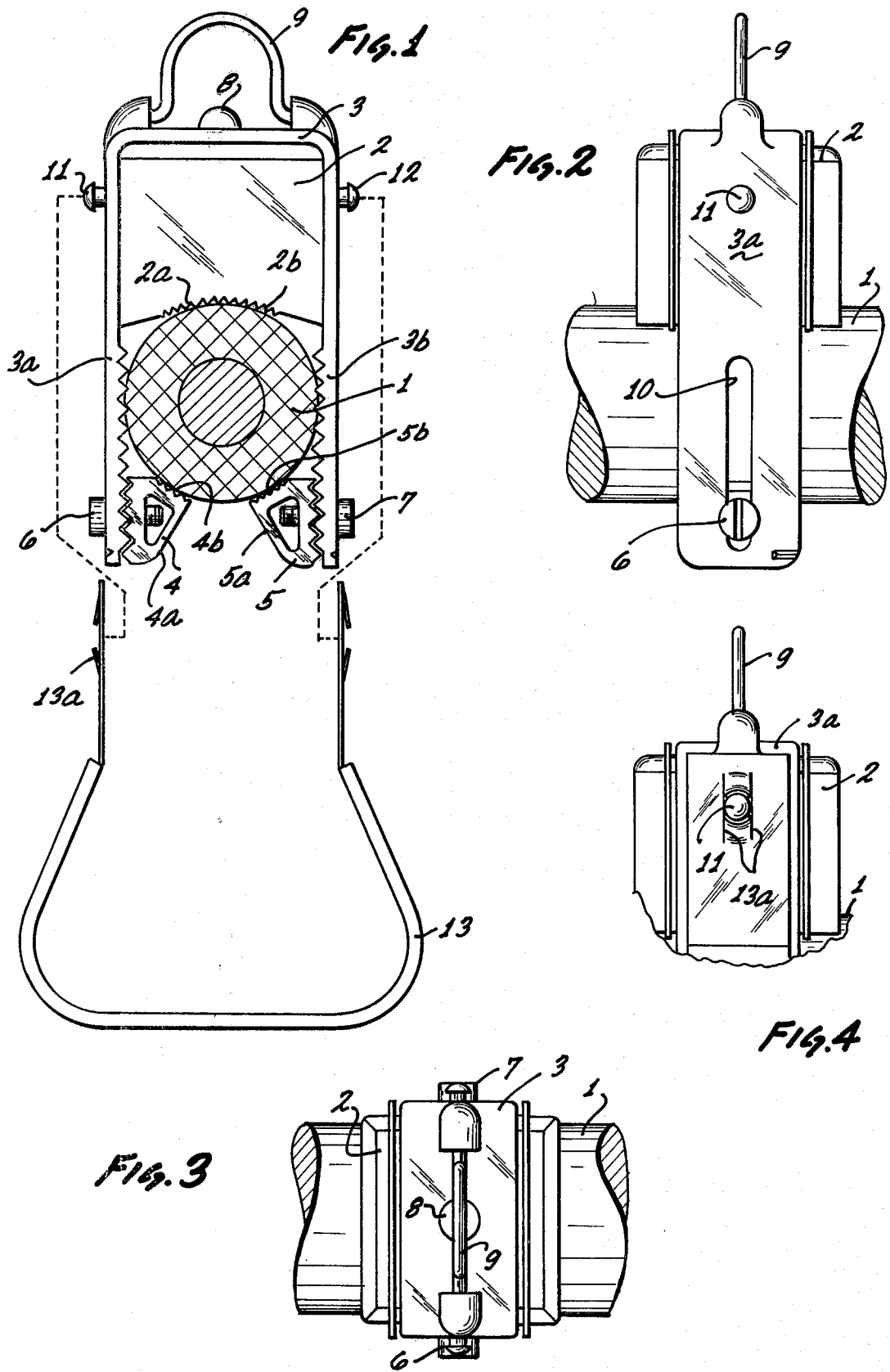

FAULT INDICATOR CASE AND MOUNT

BACKGROUND OF THE INVENTION

The present invention relates to faulted or short-circuit indicators, and more particularly, the invention relates to short-circuit or line fault indicators for electrical cable.

Such indicators are, for example, described in U.S. Pat. No. 4,101,826, and include a reed-type relay being operated by the magnetic field around a cable conductor and triggering an electronic circuit for issuing a visible warning signal, being maintained even if the fault condition ceases.

The electronic circuit for such a fault indicator may be disposed in a cylindrical plastic case whose one front end is configured to be plugged in on a cylindrical, insulated high-voltage-type connection. It follows that with such a mount a fault indicator can be positioned only in certain, limited points along a high-voltage cable.

DESCRIPTION OF THE INVENTION

It is an object of the present invention to provide a new and improved housing or case construction for a short-circuit or fault indicator which can be placed on any point of a high-voltage cable, current bus, overhead cable of various diameters, etc., particularly without having to separate the cable, bus, conduction, from its source of potential for purposes of mounting the indicator.

It is a specific object of the present invention to provide a casing for a fault indicator of the type described in the above-identified patent.

In accordance with the preferred embodiment of the invention, it is suggested to provide the housing or case containing the transducing and electronic equipment for such a fault indicator with a shallow concave-type front face along which extend two arms carrying at their ends jaws engaging the cable, conductors, etc., generally opposite the engagement thereof with the concave front face. The arms and the rear sides of the jaws are preferably serrated for better engagement of each other. The jaws have oblique cam surfaces to obtain spreading of the resilient legs upon pushing the assembly over a cable. A shield can be separately fastened to the case.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 1 is a side view of a short-circuit-indicator housing or case in accordance with the preferred embodiment, being shown placed on a cable illustrated in section;

FIGS. 2 and 3 are, respectively, front and top views of the indicator of FIG. 1; and FIG. 4 is an analogous view as shown in FIG. 2, but with a supplemented shield.

Proceeding now to the detailed description of the drawings, FIG. 1 shows an insulated cable 1, carrying a case 2 of parallel-epided configuration and including the electrical components of a short-circuit and line fault indicator such as shown and described in my above-identified patent. This includes particularly transducing means such as a reed relay being responsive to the magnetic field that surrounds the conductor of cable 1. The relay response of the field and current in cable 1 exceeds a particular value and an indicating lamp 8 is caused to blink.

Case 2 has a front end defined by two surfaces 2a and 2b which are inclined to each other by an obtuse, rather shallow angle. This way, one obtains an overall concave-type configuration for this face of the case. The two surfaces are serrated to facilitate and secure engagement with the cable. The rather shallower angle defining the concave contour permits the case to be placed on a wide variety of cables with different diameters.

The case 2 is inserted into a U-shaped bracket or holder 3 having legs 3a and 3b. Jaws 4 and 5 are, respectively, mounted on the legs in that a serrated rear of each jaw engages serrations on the inside of legs 3a and 3b. The serrators on the legs do also engage the cable and contribute to the mounting.

The jaws have additionally oblique mounting and holding surfaces 4b, 5b, respectivley, for engaging the cable somewhat opposite the engagement of the cable by the concave front 2a, 2b. Jaws 4 and 5 have additionally oblique camming surfaces 4a, 5a, facilitating slipping the device over the cable.

The legs have oblong slots such as 10 for insertion of fastener bolts 6 and 7. These bolts tighten the jaws to the legs 3a, 3b, and the slot permits the jaws 4, 5 to be fastened to different points of the legs so as to better accommodate the casing and its positioning to different diameter cable. The mutually engaging serrations of the jaws and the legs prevent slipping of the former on the latter. The legs 3a, 3b have a certain degree of resiliency so that they can be slightly spread to snap the casing onto a cable. Particularly when the assembly 2, 3 (3a, 3b), 4 and 5 as assembled are pushed onto the cable, the camming surfaces 4a and 5a as engaging the cable spread the legs so that the cable can indeed be inserted in the space defined by the surfaces 2a, 2b, serrations of 3a, 3b, 4b and 5b.

The other end of the case, or one can say its top, is provided with the light emitting diode 8 which will blink in the case of a short circuit. A bail 9 is hinged to the outer crossbar of the U-shaped member 3 to facilitate carrying and positioning of the device during installation or for dismounting. FIG. 3 shows guide edges permitting mounting of the cable by means of conventional insulating rods without requiring shutdown of the installed and conducting cable.

FIG. 1 shows in exploded view fashion a shield of ferromagnetic material. This shield has to be fastened to the case after installation and mounting of the latter and grips around the cable from below. The case is provided with rivets 11 and 12, and the sheet or shield 13 has suitable openings with slots 13a permitting the shield arms to be snapped onto the rivets. FIG. 4 is a side view similar to FIG. 2 but showing the shield snapped on. One will need a special, insulated tool for mounting the shield to the case; or one will have to shut down the cable.

The invention is not limited to the embodiments described above but all changes and modifications thereof not constituting departures from the spirit and scope of the invention are intended to be included.

I claim:

1. A short-circuit and line fault indicator having a case which contains an electronic circuit including a reed relay to be actuated by a magnetic field surrounding a conductor, the improvement of the case comprising:

the case having a generally shallow concave front face for engagement with a cable, conductor, or the like, but for extending laterally beyond the cable or conductor when centrally in engagement therewith;

resilient holding legs extending beyond and to both sides of said face, for extension along and adjacent to opposite sides of such a cable or conductor; and support jaws adjustably mounted on the ends of the legs, and bearing against the cable or conductor from a side generally opposite points of engagement between the face and the cable or conductor.

2. A fault indicator as in claim 1, said face being configured as two surfaces intersecting at an obtuse angle.

3. A fault indicated as in claim 1, said jaws having oblique camming surfaces for spreading the legs upon engagement with the cable or conductor for placement of the case thereon.

4. A fault indicator as in claim 1, said arms having oblong slots traversed by short, clamping screws for adjustably mounting said jaws.

5. A fault indicator as in claim 1, said arms and rear surfaces of the jaws engaging the arms being provided with serrations.

6. A fault indicator as in claim 1, including holding rivets and a shield mounted to the rivets and extending partially around the cable adjacent the jaws.

7. A fault indicator as in claim 1, including a bail pivotally hinged to the case opposite said face.

* * * * *